United States Patent
Tuttle

(10) Patent No.: US 7,078,239 B2
(45) Date of Patent: Jul. 18, 2006

(54) INTEGRATED CIRCUIT STRUCTURE FORMED BY DAMASCENE PROCESS

(75) Inventor: Mark E. Tuttle, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 230 days.

(21) Appl. No.: 10/655,666

(22) Filed: Sep. 5, 2003

(65) Prior Publication Data

US 2005/0051818 A1 Mar. 10, 2005

(51) Int. Cl.
H01L 21/00 (2006.01)

(52) U.S. Cl. .......................................... 438/3; 438/692
(58) Field of Classification Search .................. 438/3, 438/692, 741, 745, 723, 725, 705; 257/326
See application file for complete search history.

(56) References Cited

U.S. PATENT DOCUMENTS

| | | |
|---|---|---|
| 3,623,032 A | 11/1971 | Schapira |
| 3,623,035 A | 11/1971 | Kobayashi et al. |
| 3,816,909 A | 6/1974 | Maeda et al. |
| 3,947,831 A | 3/1976 | Kobayashi et al. |
| 4,044,330 A | 8/1977 | Johnson et al. |
| 4,060,794 A | 11/1977 | Feldman et al. |
| 4,158,891 A | 6/1979 | Fisher |
| 4,455,626 A | 6/1984 | Lutes |
| 4,731,757 A | 3/1988 | Daughton et al. |
| 4,780,848 A | 10/1988 | Daughton et al. |
| 5,039,655 A | 8/1991 | Pisharody |
| 5,064,499 A | 11/1991 | Fryer |
| 5,140,549 A | 8/1992 | Fryer |
| 5,432,734 A | 7/1995 | Kawano et al. |
| 5,496,759 A | 3/1996 | Yue et al. |
| 5,547,599 A | 8/1996 | Wolfrey et al. |

(Continued)

FOREIGN PATENT DOCUMENTS

| JP | 2000 090658 A | 3/2000 |
|---|---|---|
| WO | WO 00 72324 A | 11/2000 |

OTHER PUBLICATIONS

Pohm et al., "The Architecture of a High Performance Mass Store with GMR Memory Cells," IEEE Transactions on Magnetics, vol. 31, No. 6, Nov. 1995.

Pohm et al., "Experimental and Analytical Properties of 0.2 Micron Wide, Multi–Layer, GMR, Memory Elements", IEEE Transactions on Magnetics, vol. 32, No. 5, Sep. 5, 1996.

Prinz, "Magnetoelectronics", Science Magazine, vol. 282, Nov. 27, 1998.

Wang et al., Feasibility of Ultra–Dense Spin–Tunneling Random Access Memory, IEEE Transactions on Magnetics, vol. 33, No. 6, Nov. 1997.

(Continued)

*Primary Examiner*—David Nelms
*Assistant Examiner*—Thinh T Nguyen
(74) *Attorney, Agent, or Firm*—Knobbe Martens Olson & Bear, LLP

(57) ABSTRACT

An integrated circuit structure is formed using a damascene process that involves forming a trench or cavity for the structure in a temporary layer of material. A conductive material, such as copper, can then be deposited on the temporary layer to overfill the trench or cavity, and the excess conductive material can be removed by polishing down to the surface of the temporary layer. The integrated circuit structure can then be exposed by removing the temporary layer. One example of an integrated circuit structure that can be formed using this method is an upper electrode in an MRAM array. By using the process to form an upper electrode in an MRAM array, the process of forming a magnetic keeper around the upper electrode is advantageously simplified.

10 Claims, 6 Drawing Sheets

U.S. PATENT DOCUMENTS

| | | | |
|---|---|---|---|
| 5,569,617 A | | 10/1996 | Yeh et al. |
| 5,587,943 A | | 12/1996 | Torok et al. |
| 5,661,062 A | | 8/1997 | Prinz |
| 5,741,435 A | | 4/1998 | Beetz, Jr. et al. |
| 5,846,881 A | * | 12/1998 | Sandhu et al. ............... 438/683 |
| 5,861,328 A | | 1/1999 | Tehrani et al. |
| 5,902,690 A | | 5/1999 | Tracy et al. |
| 5,940,319 A | | 8/1999 | Durlam et al. |
| 5,956,267 A | | 9/1999 | Hurst et al. |
| 6,007,733 A | * | 12/1999 | Jang et al. .................... 216/80 |
| 6,048,739 A | | 4/2000 | Hurst et al. |
| 6,048,789 A | * | 4/2000 | Vines et al. ................ 438/633 |
| 6,165,803 A | | 12/2000 | Chen et al. |
| 6,174,737 B1 | | 1/2001 | Durlam et al. |
| 6,211,090 B1 | * | 4/2001 | Durlam et al. .............. 438/692 |
| 6,413,788 B1 | | 7/2002 | Tuttle |
| 6,417,561 B1 | | 7/2002 | Tuttle |
| 6,475,812 B1 | | 11/2002 | Nickel et al. |
| 6,510,078 B1 | | 1/2003 | Schwarzl |
| 6,548,849 B1 | * | 4/2003 | Pan et al. ................... 257/296 |
| 6,555,858 B1 | | 4/2003 | Jones et al. |
| 6,556,473 B1 | | 4/2003 | Saito et al. |
| 6,580,636 B1 | | 6/2003 | Thewes et al. |
| 6,661,688 B1 | | 12/2003 | Bloomquist et al. |
| 6,872,993 B1 | | 3/2005 | Zhu et al. |
| 2004/0032010 A1 | | 2/2004 | Kools et al. |
| 2004/0037109 A1 | | 2/2004 | Witcraft et al. |
| 2004/0057295 A1 | | 3/2004 | Matsukawa et al. |

OTHER PUBLICATIONS

M. Durlam, et al., "A low power 1Mbit MRAM based on 1T1MTJ bit cell integrated with Copper Interconnects," 2002 Symposium on VLSI Circuits, Digest of Technical Papers (IEEE Jun. 2002), pp. 158–161.

Daughton, J. M., Magnetoresistive Random Access Memory, [online] NVE Corporation, Feb. 4, 2000 [retrieved on Mar. 18, 2004]. Retrieved from the Internet <URL: www.nve.com/otherbiz/mram.pdf>.

Daughton, J. M., "Advanced MRAM Concepts," [online] NVE Corporation, Feb. 7, 2001 [retrieved on Jan. 25, 2002]. Retrieved from the Internet: <URL: www.nve.com/otherbiz/mram2.pdf>.

Lee, Chih–Ling, "A Study of Magnetoresistance Random–Access Memory," date unknown.

Kaakani, H., "Non–Volatile Memory (MRAM) ANXXX," [online], Honeywell, Mar. 1999 [retrieved on Nov. 19, 2001]. Retrieved from the Internet: <URL: www.ssec.honeywell.com/avionics/h_gmr.pdf>.

* cited by examiner

INTEGRATED CIRCUIT STRUCTURE FORMED BY DAMASCENE PROCESS

BACKGROUND OF THE INVENTION

1. Field of the Invention

The present invention relates to integrated circuit structures. More specifically, the present invention relates to integrated circuit structures formed by damascene processes.

2. Description of the Related Art

Integrated circuit structures comprising certain metals, such as aluminum, can be formed by depositing a layer of the metal on a substrate, patterning the metal with photoresist, and selectively dry etching the metal to form the desired structure. Other metals, such as copper, can be difficult to dry etch. Nevertheless, integrated circuit structures can be formed from such metals by using a damascene process. In a damascene process, a layer of insulating material is deposited on a substrate, patterned with photoresist, and selectively etched to form trenches or cavities for the desired metallic structures. The metal can then be deposited on the insulating layer to overfill the trenches or cavities, and the excess metal can be removed by polishing down to the surface of the insulating layer.

One example of an integrated circuit structure commonly formed using a damascene process is a conductive line in a magnetic random access memory (MRAM) device. An MRAM device typically comprises a plurality of magnetic memory cells organized into an array having any of a wide variety of configurations. One exemplary configuration is a "cross-point" memory array, which comprises a first set of parallel conductive lines covered by an insulating layer, over which lies a second set of parallel conductive lines, perpendicular to the first lines. One set of conductive lines is referred to as the "bit" lines, and the other set of conductive lines is referred to as the "word" lines. The magnetic memory cells can be sandwiched between the bit lines and the word lines at their intersections. Due to the high current demands of an MRAM device, the bit lines and word lines of the array are often made of copper.

When current flows through a bit line or a word line, it generates a magnetic field around the line. In a typical MRAM device, the state of a given memory cell can be switched by flowing current through the word line and the bit line corresponding to the memory cell. The sum of the two generated fields is sufficient to switch or "flip" the bit.

However, as the density of magnetic memory cells within an array increases, so does the possibility of cross talk between a bit line or a word line and nearby memory cells, which can cause unintended switching of memory cells. To reduce the likelihood of such cross talk, it is desirable to localize the magnetic field generated by a word line or a bit line carrying current. One approach for localizing this magnetic field is to surround each word line and bit line within an MRAM array with a magnetic keeper. For example, U.S. Pat. No. 6,413,788, which is hereby incorporated by reference in its entirety, discloses a variety of magnetic keeper configurations and methods of forming such magnetic keepers.

SUMMARY OF THE INVENTION

In one embodiment of the present invention, a magnetic memory device in an integrated circuit comprises a lower electrode formed over a semiconductor substrate and a magnetic memory cell formed over the lower electrode. The magnetic memory device further comprises an upper electrode with a bottom surface facing toward the magnetic memory cell, a top surface facing away from the magnetic memory cell and two side surfaces facing away from the magnetic memory cell. The magnetic memory device further comprises a magnetic keeper comprising at least one continuous layer of magnetic material covering the top surface and at least two side surfaces of the upper electrode.

In another embodiment, an integrated circuit element comprises a copper structure having a top surface and at least two side surfaces and a coating comprising a continuous layer of material adjacent to the top surface and at least two side surfaces of the copper structure.

In another embodiment, a method of forming an electrode in an MRAM device comprises forming a conductive line in a trench within a temporary layer using a damascene process, the conductive line having a bottom surface facing toward a magnetic memory cell, a top surface facing away from the magnetic memory cell, and two side surfaces facing away from the magnetic memory cell. The method further comprises removing the temporary layer such that the top surface and at least two side surfaces of the conductive line are exposed.

In another embodiment, a method of forming an integrated circuit structure comprises providing a temporary layer having an upper surface, etching a cavity into the temporary layer, and filling the cavity with copper such that a copper structure is formed within the cavity. The method further comprises planarizing the copper with the upper surface of the temporary layer and selectively etching the temporary layer such that the copper structure is exposed.

In another embodiment, a method of forming an integrated circuit element comprises providing a temporary layer having an upper surface, etching a cavity into the temporary layer, and depositing a layer of a first conductive material over the temporary layer, thereby forming a conductive structure within the cavity. The method further comprises planarizing the layer of first conductive material with the upper surface of the temporary layer, selectively etching the temporary layer, thereby exposing an upper surface and at least two side surfaces of the conductive structure, and covering the upper surface and at least two side surfaces of the conductive structure with a continuous layer of a second conductive material.

BRIEF DESCRIPTION OF THE DRAWINGS

These and other features and advantages of the invention will now be described with reference to the drawings of certain preferred embodiments, which are intended to illustrate, and not to limit, the invention.

DETAILED DESCRIPTION OF THE PREFERRED EMBODIMENT

The present invention relates to integrated circuit structures formed by a damascene process. The structures typically comprise a conductive material that is difficult to dry etch, such as, for example, copper. In the following description of exemplary embodiments of the invention, the structures are described as comprising copper. Those of ordinary skill in the art will understand, however, that the structures may comprise a variety of other suitable materials.

In some embodiments, the damascene process begins by forming a temporary layer of material on a substrate. It should be understood that the initial layer is referred to as a "temporary" layer because it is eventually removed during the damascene process, and not because it necessarily constitutes a material that is typically associated with temporary structures in the art of integrated circuit fabrication. Indeed, the temporary layer may comprise any material that is selectively etchable relative to copper and other materials adjacent to the temporary layer. Therefore, while the temporary layer in some embodiments may comprise a material that is typically associated with temporary structures in the art of integrated circuit fabrication, the temporary layer in other embodiments may comprise any of a wide variety of materials that are typically associated with more permanent structures.

Following the formation of the temporary layer, trenches or cavities for the desired structures can be formed in the temporary layer. Copper can then be deposited on the temporary layer to overfill the trenches or cavities, and the excess copper can be removed by polishing down to the surface of the temporary layer. The copper structures can then be exposed by removing the temporary layer.

Unlike the damascene process described above, conventional damascene processes do not begin by depositing a temporary layer that is later removed. Instead, the initial layer deposited in a conventional damascene process typically remains in place when the process is complete. Thus, unlike the damascene process described above, a conventional damascene process results in a structure that is imbedded in a layer of material rather than an exposed structure.

The damascene process described above can be used to form a wide variety of integrated circuit structures. For example, in some embodiments, the process is used to form a plurality of copper conductive lines in an MRAM array. Examples of these embodiments are described in more detail below. For purposes of illustration, these embodiments will be described in the context of an MRAM device having a particular configuration. The details associated with this specific configuration are set forth to illustrate, and not to limit, the invention. The scope of the invention is defined only by the appended claims.

Figure 1:
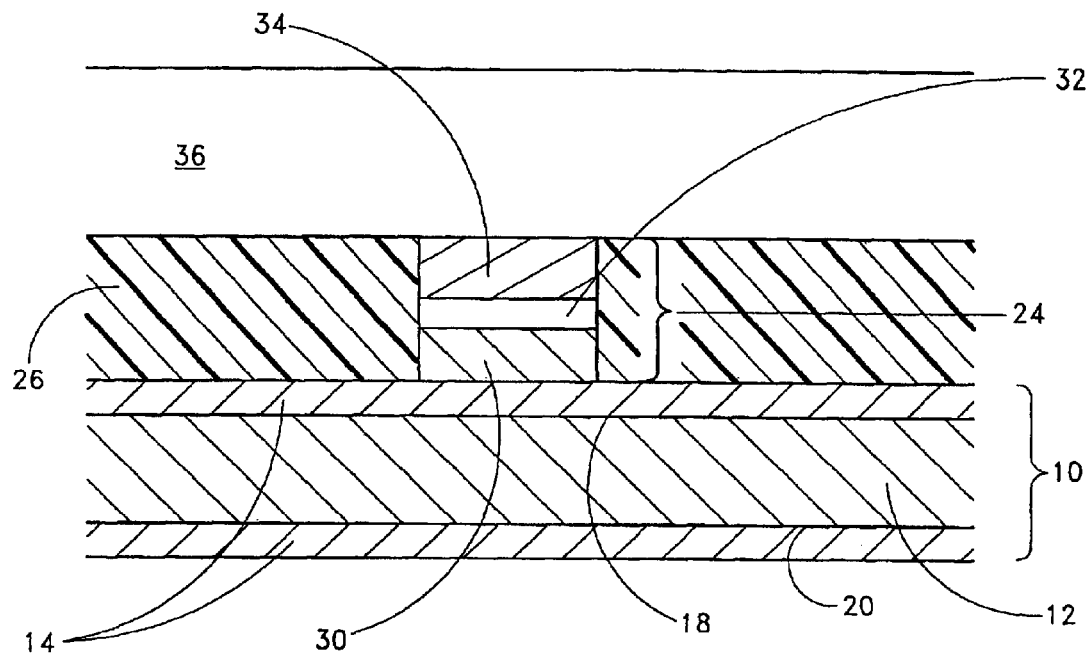
FIG. 1 illustrates a cross-sectional view of a partially fabricated MRAM structure.

FIG. 1 illustrates a cross-sectional view of a partially fabricated MRAM structure. In the illustrated embodiment, the structure includes a magnetic memory cell 24 formed over a lower electrode 10 comprising a lower conductive line 12 surrounded by a barrier layer 14. In some embodiments, the lower conductive line 12 comprises copper, and the barrier layer 14 comprises tantalum, tantalum nitride, or another material that blocks the diffusion of copper and is compatible with integrated circuit manufacture.

The lower electrode 10 runs from side to side across the page and, in the cross-sectional view of FIG. 1, is cut near the center along its long axis. As a result, only the portions of the barrier layer 14 that clad the lower conductive line 12 along the upper surface 18 and the lower surface 20 can be seen. The cladding along one side of the lower conductive line 12 is above the plane of the page and along the other side of the lower conductive line 12 is below the plane of the page. In some embodiments, there is no barrier layer 14 along the upper surface 18 of the lower conductive line 12. In these embodiments, the magnetic memory cell 24 is formed directly on top of the lower conductive line 12.

In some embodiments, the lower conductive line 12, aside from the upper surface 18, is surrounded by a magnetic keeper. A magnetic keeper may comprise any structure that tends to localize the magnetic field generated by a conductive line carrying a current. For example, in some embodiments, the magnetic keeper comprises a layer of soft magnetic material sandwiched between two barrier layers. It should be understood, however, that the barrier layers are typically not necessary to confine the magnetic field generated by a conductive line carrying a current. Thus, in other embodiments, the magnetic keeper comprises only a single layer of magnetic material. The top surface 18 of the lower conductive line 12 preferably has no magnetic keeper because it may interfere with the interaction between the lower electrode 10 and the magnetic memory cell 24. U.S. Pat. No. 5,956,267, which is hereby incorporated by reference in its entirety, discloses a variety of magnetic keeper configurations for lower electrodes and methods of forming such magnetic keepers.

The magnetic memory cell 24 may comprise any magnetic structure that stores digital bits of data, including thin ferromagnetic films or more complex layered magnetic thin-film structures, such as tunneling magnetoresistance (TMR) or giant magnetoresistance (GMR) elements. For example, in the illustrated embodiment, the magnetic memory cell 24 comprises a conventional TMR structure, which comprises a first ferromagnetic layer 30, a barrier layer 32, and a second ferromagnetic layer 34. The magnetic memory cell 24 may be formed using a variety of methods and materials that are well-known to those of skill in the art.

For example, in some embodiments, the first ferromagnetic layer 30 may comprise a stack of magnetic and associated adjacent sublayers, such as, for example, a tantalum seed sublayer, a nickel-iron seed sublayer, an iridium manganese pinning sublayer and a nickel-iron or nickel-iron-cobalt sublayer. The barrier layer 32 may comprise, for example, aluminum oxide, having a thickness within the range of about 0.5 nm to about 3 nm, preferably within the range of about 1 nm to about 2 nm. Like the first ferromagnetic layer 30, the second ferromagnetic layer 34 may comprise a stack of magnetic and associated adjacent blanket sublayers, such as, for example, a nickel-iron or nickel-iron-cobalt sublayer, a tantalum barrier sublayer and a tungsten nitride sublayer. The first ferromagnetic layer 30 and the second ferromagnetic layer 34 may each have a thickness within the range of about 10 nm to about 60 nm, more preferably within the range of about 20 nm to about 50 nm.

In the illustrated embodiment, the magnetic memory cell 24 is surrounded by an insulating layer 26, which can also be formed using a variety of well-known methods and materials. For example, in some embodiments, the insulating layer 26 comprises silicon nitride or a form of silicon oxide. One advantage of forming the insulating layer 26 of silicon nitride is that this material is a good barrier against the diffusion of magnetic materials, and it is resistant to a number of etchants that can be used to selectively etch an overlying oxide layer. The insulating layer 26 can be deposited over the magnetic memory cells 24 and polished back to expose the top surface of the magnetic memory cell 24 using a suitable method, such as, for example, chemical mechanical planarization (CMP). An optional etch stop layer (not shown) can then be deposited over the insulating layer 26 and memory cells 24.

In the illustrated embodiment, an upper electrode is formed on the magnetic memory cell 24 using a damascene process. The process begins by depositing a temporary layer 36 over the insulating layer 26 and the magnetic memory cell 24, as illustrated in FIG. 1. The temporary layer 36 may comprise any material that is selectively removable relative to copper and the underlying dielectric or optional etch stop, such as, for example, photoresist, polyimide, bottom anti-reflective coating (BARC), dielectric antireflective coating (DARC), spin-on glass (SOG), phosphosilicate glass (PSG), boro-phospho-silicate glass (BPSG), or the like. The material of the temporary layer 36 can preferably withstand a polishing process, such as, for example, CMP.

Figure 2:
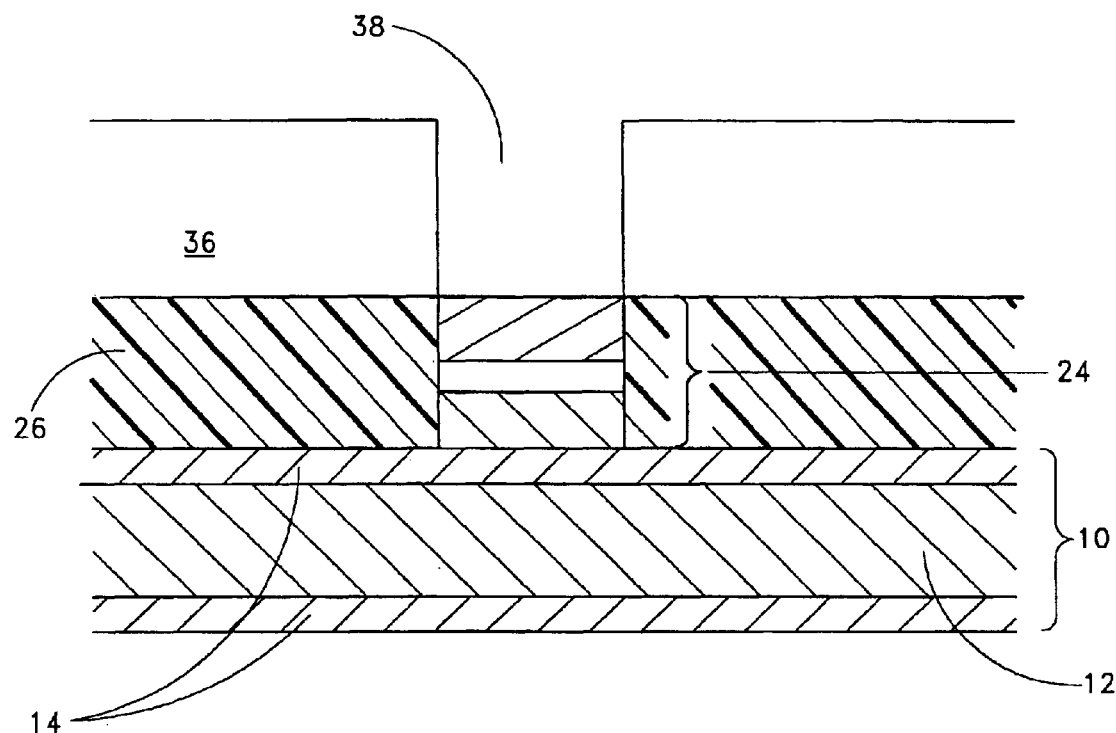
FIG. 2 illustrates the partially fabricated MRAM structure of FIG. 1 after a damascene trench has been formed in a temporary layer above magnetic bits.

As illustrated in FIG. 2, the damascene process continues by etching a trench 38 into the temporary layer 36. In the illustrated embodiment, the trench 38 runs into and out of the page, perpendicular to the lower electrode 10, and thus traverses several magnetic memory cells 24 in the array. In some embodiments, the trench 38 has a depth within the range of about 50 nm to about 800 nm, preferably about 200 nm. In some embodiments, the width of trench 38 falls within the range of about 50 nm to about 300 nm, preferably about 150 nm.

Figure 3:
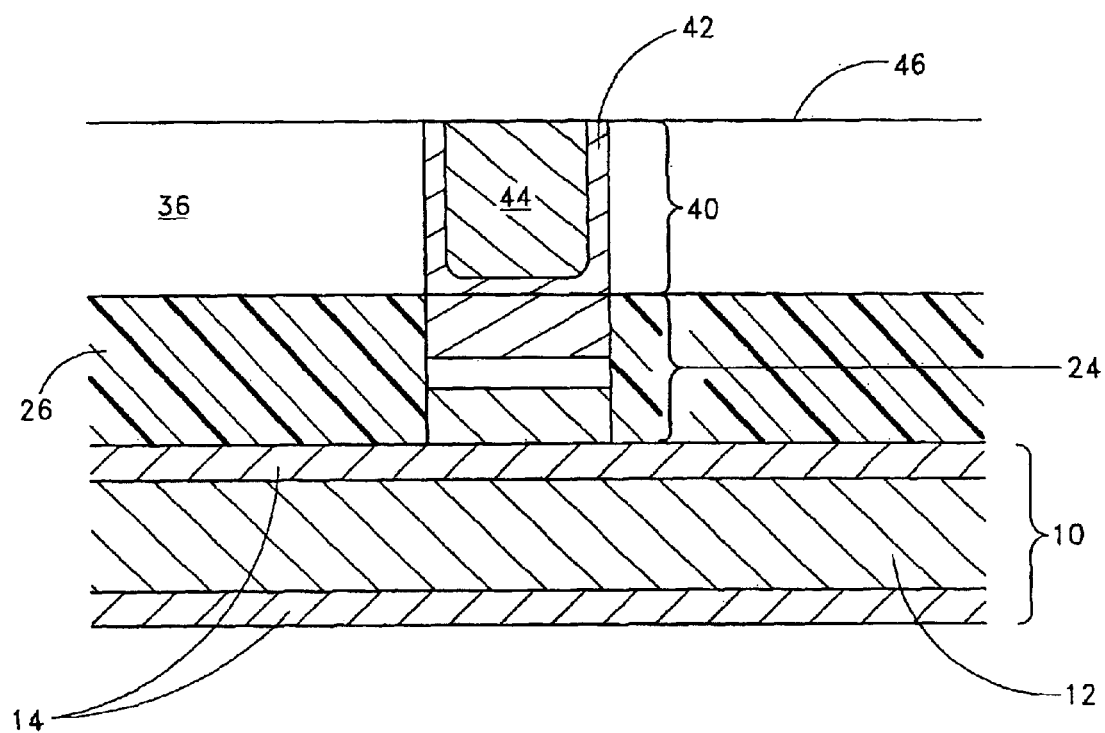
FIG. 3 illustrates the partially fabricated MRAM structure of FIG. 2 after the damascene trench has been lined with a barrier material, filled with metal, and planarized.

As illustrated in FIG. 3, the damascene process continues by lining the trench 38 with a barrier layer 42, forming an upper conductive line 44 in the lined trench 38, and planarizing the resulting structure. These steps can be performed using a variety of well-known materials and methods. For example, in some embodiments, the conductive line 44 comprises copper, and the barrier layer 42 comprises tantalum, tantalum nitride, or another material that blocks the diffusion of copper. In some embodiments, the barrier layer 42 has a thickness in the range of about 1 nm to about 20 nm, preferably in the range of about 3 nm to about 10 nm, and more preferably about 5 nm.

In some embodiments, the copper of the conductive line 44 is deposited by chemical or physical vapor deposition. In other embodiments, the copper is deposited in a two-step process wherein first a seed layer is deposited by physical vapor deposition and then the trench 38 is filled by electroplating. In some embodiments, the temporary layer 36, barrier layer 42, and conductive line 44 are planarized by polishing down the excess copper using, for example, a CMP process. The upper electrode 40 comprises the conductive line 44 and the barrier layer 42.

Figure 4:
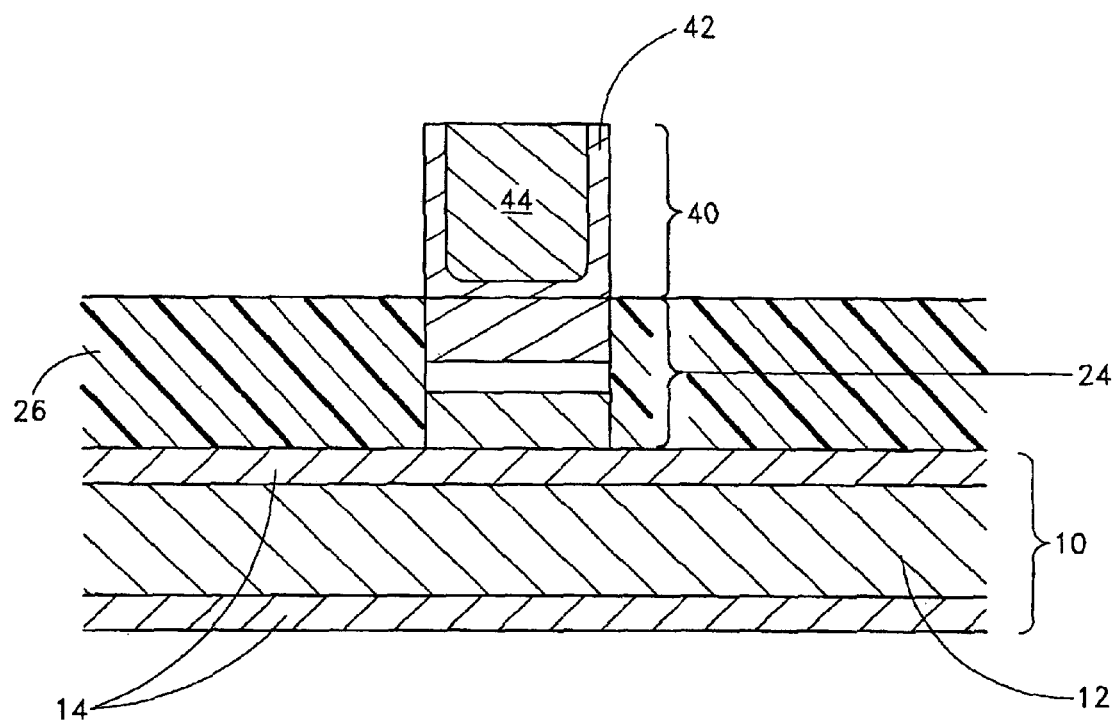
FIG. 4 illustrates the partially fabricated MRAM structure of FIG. 3 after the conductive line has been exposed by removing the temporary layer.

As illustrated in FIG. 4, the damascene process concludes by selectively etching the temporary layer 36, thereby exposing the upper electrode 40. Because the upper electrode 40 is formed using a damascene process, rather than a blanket deposition and etching process, the sidewalls of the upper electrode 40 are substantially vertical. The temporary layer 36 can be selectively etched using any of a variety of well-known etchants, preferably one that does not attack the upper electrode 40, the magnetic memory cell 24, the insulating layer 26, or the optional etch stop layer over the insulating layer 26 (if used). For example, in some embodiments, the temporary layer 36 comprises photoresist, and an organic stripper is used to remove it. In other embodiments, the temporary layer 36 comprises SOG, and a dilute HF is used to remove it.

As discussed above, it can be desirable to form a magnetic keeper around the upper electrode 40. If the upper electrode 40 were formed using a conventional damascene process, it would remain imbedded in a layer of material, and it would be somewhat difficult to form a magnetic keeper around the upper electrode 40. For example, although U.S. Pat. No. 6,413,788 ("the '788 patent") discloses a number of magnetic keeper configurations for upper MRAM electrodes formed using conventional damascene processes, these configurations can suffer from a number of drawbacks, such as, for example, requiring multiple deposition, masking, and etching steps and resulting in magnetic keepers with discontinuous magnetic layers. By using a damascene process that involves removing the temporary layer 36, the upper electrode 40 is exposed, the process of forming a magnetic keeper around the upper electrode 40 is advantageously simplified, and the aspect of avoiding the keeper material between the magnetic memory cell 24 and the upper electrode 40 is realized.

Figure 5:
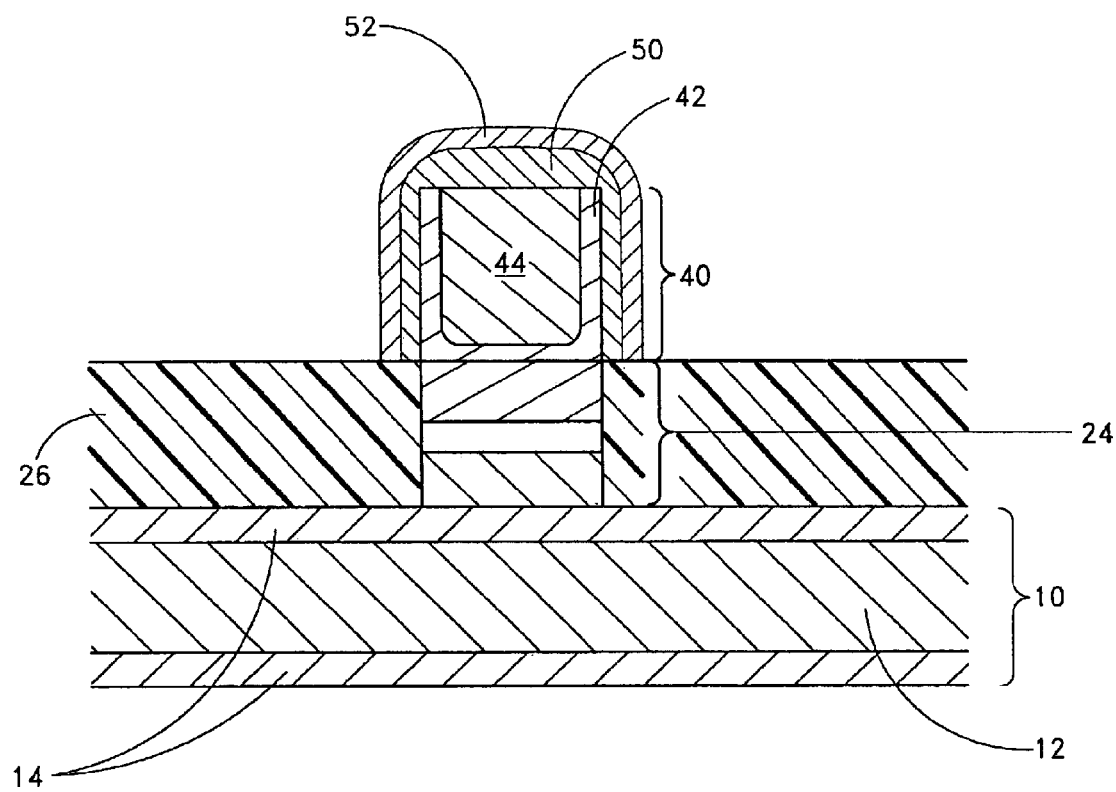
FIG. 5 illustrates the partially fabricated MRAM structure of FIG. 4 after the conductive line has been surrounded by a magnetic keeper.

As illustrated in FIG. 5, a magnetic keeper can be formed around the upper electrode 40. The magnetic keeper may comprise any structure that tends to localize the magnetic field generated by the upper electrode 40 when it carries a current. For example, in the illustrated embodiment, the magnetic keeper comprises a magnetic layer 50 and an optional barrier layer 52. In a preferred embodiment, the magnetic layer 50 comprises a conductive magnetic material, such as, for example, permalloy (Ni—Fe) or Co—Fe. In other embodiments, the magnetic layer 50 may comprise a nonconductive magnetic material, such as, for example, ferrites, manganites, cobaltites, and chromites. The barrier layer 52 may also comprise a variety of materials, such as, for example, tantalum or tantalum nitride. In a preferred embodiment, the magnetic layer 50 is formed as a continuous layer of magnetic material surrounding the upper surface and two side surfaces of the upper electrode 40.

In some embodiments, the magnetic layer 50 and the barrier layer 52 each have a thickness within the range of about 1 nm to about 20 nm, preferably within the range of about 3 nm to about 10 nm, more preferably about 5 nm. The magnetic layer 50 and the optional barrier layer 52 may be formed around the upper electrode 40 using a wide variety of methods that are well-known to those of skill in the art. For example, in some embodiments, the layers are deposited as blanket films over the upper electrode 40 and then patterned and etched using conventional techniques. In other embodiments, a conventional plating process, such as an electroless plating process or an electroplating process, is used to form the magnetic layer 50 and the barrier layer 52. Such a plating process may present a number of advantages, such as eliminating the need for further patterning and etching steps and forming a magnetic keeper that is self-aligned on the upper electrode 40.

Magnetic keepers formed using the process described above exhibit a number of advantages over other magnetic keepers for upper electrodes of an MRAM array, such as those disclosed in the '788 patent. For example, unlike the magnetic keepers disclosed in the '788 patent, the magnetic keeper illustrated in FIG. 5 has a continuous magnetic layer 50 in contact with the upper surface and two side surfaces of the upper electrode 40, as well as a continuous barrier layer 52 in contact with the magnetic layer. Moreover, the methods of forming magnetic keepers described in the present application require fewer etching steps, which may be harmful to the magnetic memory cell 24, than the methods of forming magnetic keepers described in the '788 patent.

Figure 6:
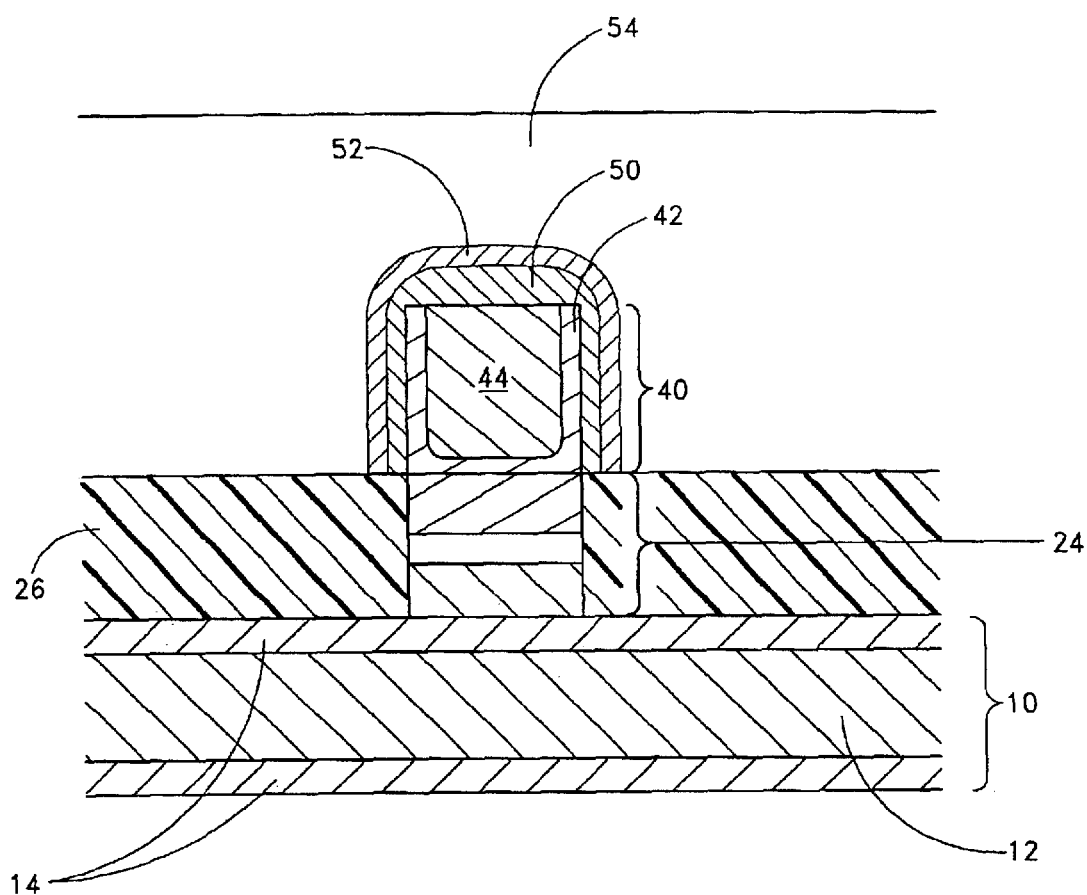
FIG. 6 illustrates the partially fabricated MRAM structure of FIG. 5 after an insulating layer has been formed over the conductive line.

As illustrated in FIG. 6, an insulating layer 54 is preferably deposited over the upper electrode 40 that is surrounded by the magnetic keeper. The insulating layer 54 may comprise a variety of nonconductive materials, such as, for example, various forms of silicon dioxide. After the insulating layer 54 is deposited, it can be planarized using, for example, a CMP process. The insulating layer 54 advantageously provides structural support to the structures within the MRAM array and isolates the upper electrodes 40 of the array from one another.

There are a number of advantages associated with forming a magnetic keeper around an upper electrode 40 of an MRAM array, as described above. For example, the magnetic keeper reduces electromigration by reducing the current required to achieve a given magnetic field at the magnetic memory cell 24 under the upper electrode 40. In addition, by containing the magnetic flux of the upper electrode 40 and directing it toward the magnetic memory cell 24, the magnetic keeper advantageously reduces the magnetic field seen by adjacent memory elements. Accordingly, the density of magnetic memory cells 24 within an MRAM array can advantageously be increased.

Although this invention has been described in terms of certain preferred embodiments, other embodiments that are apparent to those of ordinary skill in the art, including embodiments that do not provide all of the features and advantages set forth herein, are also within the scope of this invention. Accordingly, the scope of the present invention is defined only by reference to the appended claims.

What is claimed is:

1. A method of forming an electrode in a magnetic random access memory (MRAM) device, the method comprising:
   providing a magnetic memory cell;
   forming a temporary layer directly over the magnetic memory cell;
   forming a trench in the temporary layer;
   forming a conductive line within the trench;
   completely removing the temporary layer such that side walls of the conductive line are completely exposed;
   forming a magnetic layer on exposed surfaces of the conductive line; and
   forming an outer barrier layer on the magnetic layer.

2. The method as defined in claim 1, wherein the outer barrier layer is formed from tantalum or tantalum nitride.

3. The method as defined in claim 2, wherein forming the conductive line further comprises:
   forming an inner barrier layer within the trench; and
   forming a layer of conductive material over the barrier layer.

4. The method as defined in claim 3, wherein the inner barrier layer is formed from tantalum or tantalum nitride and the conductive material is formed from copper.

5. The method as defined in claim 1, wherein the magnetic layer is formed from permalloy (Ni—Fe) or cobalt iron (Co—Pc).

6. The method as defined in claim 1, wherein the magnetic layer is formed from at least one of ferrites, manganites, cobaltites, or chromites.

7. A method of forming an electrode in a magnetic random access memory (MRAM) device, the method comprising:
   providing a magnetic memory coil;
   forming a conductive line comprising copper with a bottom surface facing the magnetic memory cell;
   forming a magnetic layer on the conductive line such that the magnetic layer is formed directly on a top copper surface of the conductive line and is formed on side surfaces of the conductive line; and
   forming an outer barrier layer on the magnetic layer.

8. The method as defined in claim 7, wherein the outer barrier layer is formed from tantalum or tantalum nitride.

9. The method as defined in claim 7, wherein the magnetic layer is formed from permalloy (Ni—Fe) or cobalt iron (Co—Fe).

10. The method as defined in claim 7, wherein the magnetic layer is formed from at least one of ferrites, manganites, cobaltites, or chromites.

* * * * *